(12) United States Patent
Tran et al.

(10) Patent No.: US 12,431,900 B2
(45) Date of Patent: Sep. 30, 2025

(54) INPUT BUFFER WITH HYSTERESIS-INTEGRATED VOLTAGE PROTECTION DEVICES AND RECEIVER INCORPORATING THE INPUT BUFFER

(71) Applicant: GlobalFoundries U.S. Inc., Malta, NY (US)

(72) Inventors: Dzung T. Tran, Austin, TX (US); Deepti A. Pant, Austin, TX (US); Shibly S. Ahmed, San Jose, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 68 days.

(21) Appl. No.: 18/064,978

(22) Filed: Dec. 13, 2022

(65) Prior Publication Data

US 2024/0195416 A1   Jun. 13, 2024

(51) Int. Cl.
*H03K 19/003*   (2006.01)
(52) U.S. Cl.
CPC . *H03K 19/00361* (2013.01); *H03K 19/00315* (2013.01)
(58) Field of Classification Search
None
See application file for complete search history.

(56) References Cited

U.S. PATENT DOCUMENTS

| | | | |
|---|---|---|---|
| 4,703,201 | A | 10/1987 | McGrail |
| 6,147,540 | A | 11/2000 | Coddington |
| 6,188,244 | B1 | 2/2001 | Joo et al. |
| 6,346,829 | B1 | 2/2002 | Coddington |
| 8,293,614 | B2 | 10/2012 | Chu et al. |
| 9,306,550 | B2 | 4/2016 | Kumar |
| 9,467,125 | B2 | 10/2016 | Kumar et al. |

(Continued)

FOREIGN PATENT DOCUMENTS

EP   0176211 A1   4/1986

OTHER PUBLICATIONS

European Search Report for corresponding EP Application No. 23198270.3-1205 dated Mar. 13, 2024, 11 pages.

(Continued)

*Primary Examiner* — Jany Richardson
(74) *Attorney, Agent, or Firm* — David Cain; Hoffman Warnick LLC

(57) ABSTRACT

Disclosed is an input buffer with hysteresis-integrated voltage protection devices for avoiding violations of maximum gate-to-source voltage limitations when the maximum input voltage is greater than the maximum gate-to-source voltage limitation. The input buffer includes a chain of transistors including two P-channel FETs (PFETs) and two N-channel FETs (NFETs). The data input to the input buffer controls the gates of the transistors in the chain so the data output from the input buffer at the junction between the PFETs and NFETs is inverted. The input buffer also includes a hysteresis feedback loop to prevent noise-induced switching of the output. The hysteresis feedback loop also includes voltage protection devices integrated therein to avoid maximum gate-to-source violations when the loop results in a hysteresis voltage being fed back into the chain at the source region of a transistor in the chain. Also disclosed is a receiver incorporating the input buffer.

20 Claims, 5 Drawing Sheets

(56) References Cited

U.S. PATENT DOCUMENTS

| | | |
|---|---|---|
| 10,050,115 B2 | 8/2018 | Brown et al. |
| 2005/0104641 A1 | 5/2005 | Chen et al. |
| 2006/0189049 A1 | 8/2006 | Afentakis et al. |
| 2009/0237135 A1 | 9/2009 | Ramaraju et al. |
| 2016/0105183 A1* | 4/2016 | Kim ................ H03K 19/00315 327/333 |
| 2022/0109437 A1* | 4/2022 | Ma .................... H03K 17/6874 |
| 2023/0238956 A1* | 7/2023 | Chen .................. H03K 3/3565 327/205 |

OTHER PUBLICATIONS

Schippel et al., "A 22nm FDSOI Technology with integrated 3.3V/5V/6.5V RFLDMOS Devices for IOT SOC applications," 2018 IEEE SOI-3D-Subthreshold Microelectronics Technology Unified Conference (S3S), pp. 1-3.

Wang et al., "A Novel Orthogonal Gate EDMOS Transistor With Improved dv / dt Capability and Figure of Merit (FOM)," IEEE Electron Device Letters 2008, pp. 1-3.

U.S. Appl. No. 18/419,686, Final Office Action dated Jun. 23, 2025, 6 pages.

U.S. Appl. No. 18/419,686, Amendment to Final Office Action filed Jun. 26, 2025, 12 pages.

U.S. Appl. No. 18/419,686, Office Action dated May 8, 2025, 6 pages.

U.S. Appl. No. 18/419,686, Response to Office Action filed May 15, 2025, 14 pages.

Chen et al., "A New Schmitt Trigger Circuit in A 0.13μm 1/2.5 V CMOS Process To Receive 3.3 V Input Signals, "IEEE 2004, 4 pages.

Donato et al., "A Noise-immune Sub-threshold Circuit Design based on Selective Use of Schmitt-trigger Logic," May 2012, retrieved from: https://www.researchgate.net/publication/234680569 on Nov. 29, 2023, 7 pages.

U.S. Appl. No. 18/419,686, Application as Filed on Jan. 23, 2024, 38 pages.

U.S. Appl. No. 18/419,686, 2nd Amendment after Final Office Action filed Jul. 9, 2025, 11 pages.

U.S. Appl. No. 18/419,686, Advisory Action dated Jul. 2, 2025, 3 pages.

* cited by examiner

US 12,431,900 B2

INPUT BUFFER WITH HYSTERESIS-INTEGRATED VOLTAGE PROTECTION DEVICES AND RECEIVER INCORPORATING THE INPUT BUFFER

BACKGROUND

The present disclosure relates to input buffers and, more particularly, to embodiments of a hysteresis input buffer and a receiver incorporating the input buffer.

Input buffers can include relatively small laterally diffused metal oxide semiconductor (LDMOS) field effect transistors (FETs) for reduced area consumption. However, the trade-off is that such LDMOS FETs can have relatively low maximum voltage limitations (e.g., a relatively low maximum gate-to-source voltage (VGSmax) limitation), making them impractical for use in high voltage input buffers that employ hysteresis.

SUMMARY

Disclosed herein are embodiments of a structure and, particularly, an input buffer with hysteresis-integrated voltage protection devices for avoiding violations of maximum gate-to-source voltage limitations when the maximum input voltage is greater than the maximum gate-to-source voltage limitation. Generally, the input buffer can include a chain of first transistors connected in series. This chain can further include two intermediate nodes and an output node. The input buffer can further include a hysteresis feedback loop. The hysteresis feedback loop can include two second transistors, which are connected to the two intermediate nodes, respectively, and two voltage protection devices, which are connected to gates of the two second transistors, respectively, and to the output node.

In some embodiments, the input buffer can include a chain of first transistors connected in series. This chain can include two first P-channel transistors, a first intermediate node at a junction between the two first P-channel transistors, two first N-channel transistors, a second intermediate node at a junction between the two first N-channel transistors, and an output node at a junction between the two first P-channel transistors and the two first N-channel transistors. The input buffer can further include a hysteresis feedback loop. The hysteresis feedback loop can include two second transistors and, particularly, a second P-channel transistor connected between the first intermediate node and ground and a second N-channel transistor connected between the second intermediate node and a positive voltage rail. The hysteresis feedback loop can further include two third transistors and, particularly, a third P-channel transistor connected between a gate of the second P-channel transistor and the output node, and a third N-channel transistor connected between a gate of the second N-channel transistor and the output node.

Also disclosed herein are embodiments of another structure and, particularly, a receiver that includes the above-described input buffer. Generally, this receiver can include a receiver input stage connected to a first positive voltage rail at a first positive supply voltage level. The receiver input stage can include hysteresis input buffer. The hysteresis input buffer can include a chain of first transistors connected in series. The chain can further include two intermediate nodes and an output node. The hysteresis input buffer can further include a hysteresis feedback loop. The hysteresis feedback loop can include two second transistors connected to the two intermediate nodes, respectively, and two voltage protection devices connected to gates of the two second transistors, respectively, and to the output node. The receiver can further include a receiver output stage and a receiver level shifter connected between the output node of the receiver input stage and the receiver output stage. The receiver level shifter and the receiver output stage can be connected to a second positive voltage rail at a second positive supply voltage level that is less than the first positive supply voltage level.

BRIEF DESCRIPTION OF THE DRAWINGS

The present disclosure will be better understood from the following detailed description with reference to the drawings, which are not necessarily drawn to scale and in which.

DETAILED DESCRIPTION

In advanced semiconductor-on-insulator technology platforms, such as the fully-depleted silicon-on-insulator (FD-SOI) technology platform, input buffers formed in semiconductor-on-insulator regions typically include relatively large devices, whereas input buffers formed in hybrid regions (also referred to herein as bulk semiconductor regions) can include relatively small devices (e.g., relatively small laterally-diffused metal oxide semiconductor (LDMOS) field effect transistors (FETs)). The advantage of using smaller devices is reduced area consumption. However, such smaller devices can have relatively low maximum voltage limitations (e.g., a relatively low maximum gate-to-source voltage (VGS) limitation), making them impractical for use in high voltage input buffers that employ hysteresis. For example, 22 nm FDSOI LDMOS FETs can have a maximum VGS of less than 2.5V (e.g., of 1.98V) making them impractical for use in 22 nm FDSOI 5V or 3.3V hysteresis input buffers.

In view of the foregoing, disclosed herein are embodiments of an input buffer with hysteresis-integrated voltage protection devices for avoiding violations of maximum gate-to-source voltage limitations when the maximum input voltage is greater than the maximum gate-to-source voltage limitation. Specifically, the input buffer can include a chain of transistors (e.g., laterally diffused metal oxide semiconductor (LDMOS) field effect transistors (FETs) or any other suitable type of FETs). The FETs in the chain can include two P-channel FETs (PFETs) and two N-channel FETs (NFETs). The data input to the input buffer can control the gates of the transistors in the chain so the data output from the input buffer at the junction between the PFETs and NFETs is inverted. The input buffer can also include a hysteresis feedback loop to prevent noise-induced switching of the output. The hysteresis feedback loop can further include voltage protection devices integrated therein to avoid maximum gate-to-source violations when the loop results in a hysteresis voltage being feed back into the chain at the source region of a transistor in the chain. Also disclosed herein are embodiments of a receiver that incorporates the input buffer as a receiver input stage.

Figure 1:
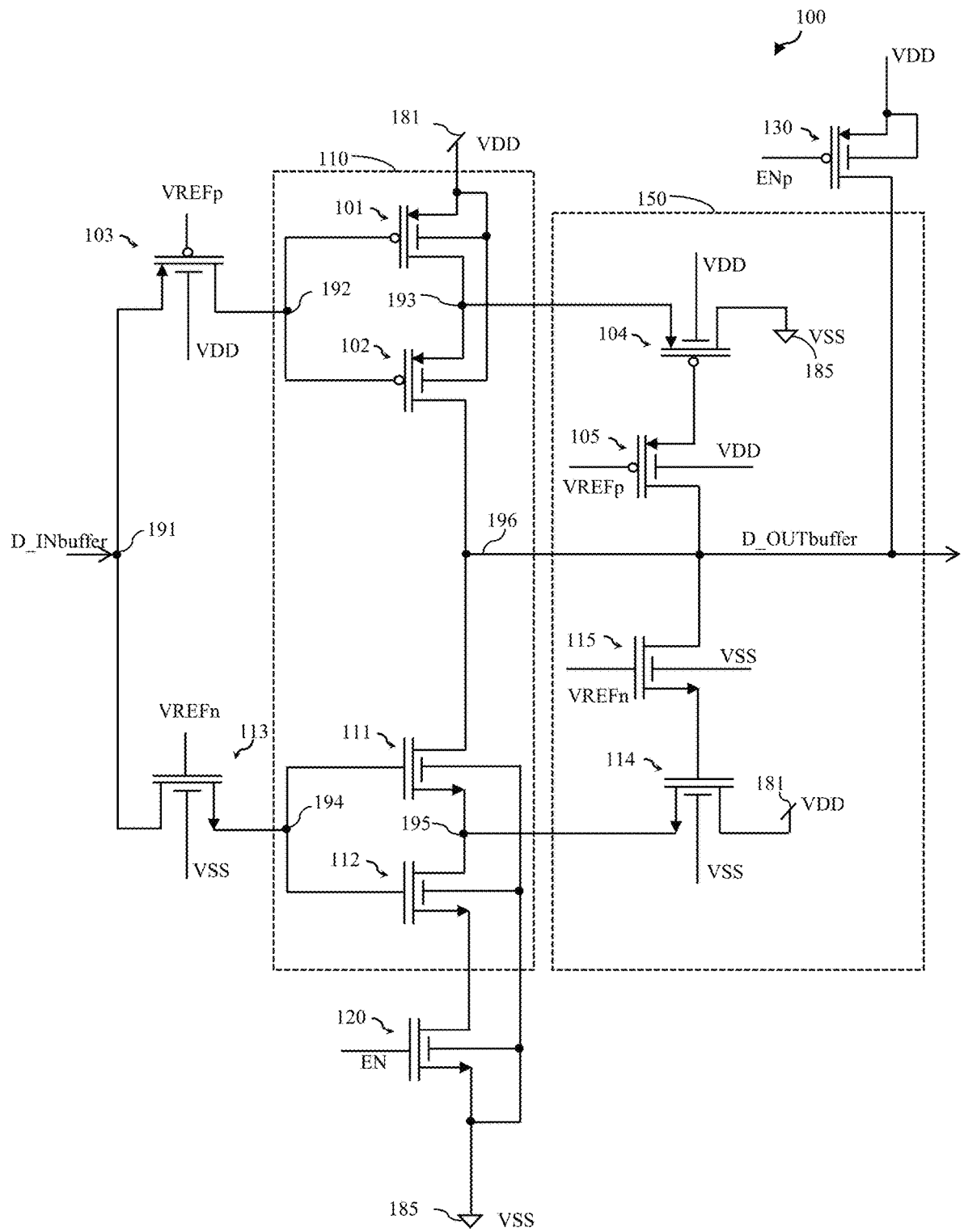
FIG. 1 is a schematic diagram illustrating disclosed embodiments of an input buffer structure.

FIG. 1 is a schematic diagram illustrating embodiments of an input buffer 100 (e.g., a radio frequency (RF) input buffer) with hysteresis-integrated voltage protection devices 105 and 115.

The input buffer 100 can have an input node 191 connected to receive a data input (D_INbuffer). D_INbuffer can swing between a low voltage level equal to a ground voltage level (VSS) and a high voltage level equal to a positive supply voltage level (VDD). VDD can be a relatively high positive supply voltage of, for example, 3.0 volts (V) to 6.5V (e.g., 5V) or even higher. The low voltage level can be indicative of D_INbuffer value of 0 and the high voltage level can be indicative of a D_INbuffer value of 1.

The input buffer 100 can include multiple transistors, as discussed in greater detail below. Additionally, these transistors can have maximum voltage limitations that could potentially be violated given the voltage swing between VDD and VSS. For example, the transistors in the input buffer 100 could be field effect transistors (FETs) that have a maximum gate-to-source voltage (VGSmax) limitation that is less than the maximum voltage swing between VDD and VSS. For example, in some embodiments, the VDD to VSS swing could be greater than 3.0V (e.g., 3.3V, 5.0V, 6.5V, etc.) and VGSmax could be less than 2.0V (e.g., 1.98V). In some embodiments, the input buffer 100 can be incorporated into an advanced semiconductor-on-insulator (e.g., FDSOI) radio frequency (RF) integrated circuit (IC) device. In some embodiments, the transistors of the input buffer 100 could be formed in a hybrid region (i.e., a bulk semiconductor region) of such an RFIC device.

Figure 2:
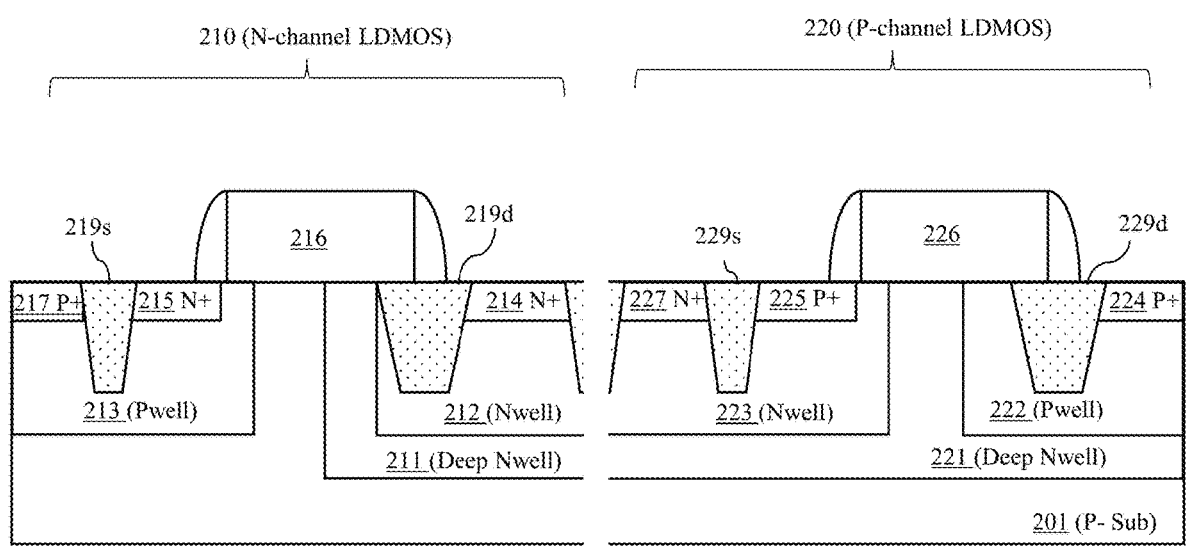
FIG. 2 is a cross-section diagram illustrative of transistors that could be incorporated into the input buffer structure of FIG. 1.

In some embodiments, the various transistors of the input buffer 100 (as described in greater detail below and illustrated in the schematic diagram of FIG. 1) could specifically be RFLDMOS FETs formed in a hybrid region of such an RFIC device. FIG. 2 is a cross-section diagram illustrative of a semiconductor structure including RFLDMOS FETs (e.g., an RFLDMOS NFET 210 and an RFLDMOS PFET 220) that could be used to form the input buffer 100. As discussed below, such RFLDMOS FETs can include a source region, a drain region, and a gate between the source region and the drain region but closer to the source region. Specifically, the semiconductor structure can include a base semiconductor substrate 201. The base semiconductor substrate 201 can be, for example, a monocrystalline silicon substrate doped so as to have P-type conductivity at a relatively low conductivity level (e.g., so as to be a P-substrate).

The RFLDMOS NFET 210 (referred to hereafter as NFET 210) can include a Pwell 213 in the P-substrate 201. The conductivity level of the Pwell 213 can be higher than the conductivity level of the P-substrate 201. The NFET 210 can further include a deep Nwell 211 in the P-substrate 201, where vertical junctions between the Pwell 213 and P-substrate 201 and between the deep Nwell 211 and the P-substrate are separated by a portion of the P-substrate. The NFET 210 can further include an additional Nwell 212 within, shallower than, and having a higher conductivity level than the deep Nwell 211. The additional Nwell 212 can further physically separated from the vertical junction between the deep Nwell 211 and the P-substrate 201. The NFET 210 can further include, in and/or adjacent to the Pwell 213, a P+ Pwell contact region 217 and an N+ source region 215, wherein the N+ source region 215 is isolated from the P+ Pwell contact region 217 by a trench isolation region 219s extending into the Pwell 213. The NFET 210 can further include, in and/or adjacent to the Nwell 212, an N+ drain region 214, wherein the N+ drain region 214 is laterally separated from a vertical junction between the deep Nwell 211 and the Nwell 212 by a trench isolation region 219d. The NFET 210 can further include a gate structure 216 on the top surface of the P-substrate 201 between the N+ source region 215 and the N+ drain region 214, but closer to the N+ source region 215. This gate structure 216 can, for example, extend laterally from above the Pwell 213, across the vertical junction between the Pwell 213 and the P-substrate 201, across the vertical junction between the P-substrate 201 and the deep Nwell 211, across the vertical junction between the deep Nwell 211 and the Nwell 212 and onto the trench isolation region 219d.

The RFLDMOS PFET 220 (referred to hereafter as PFET 220) can include a deep Nwell 221 and the P-substrate 201. The PFET 220 can further include an additional Nwell 223 within, shallower than, and having a higher conductivity level than the deep Nwell 221. The PFET 220 can further include a Pwell 222 within and shallower than the deep Nwell 221. The additional Nwell 223 and the Pwell 222 can be physically separated from each other. That is, a vertical junction between the Nwell 223 and the deep Nwell 221 can be physically separated from a vertical junction between the deep Nwell 221 and the Pwell 222 by a portion of the deep Nwell 221. The PFET 220 can further include, in and/or adjacent to the Nwell 223, an N+ Nwell contact region 227 and a P+ source region 225, wherein the P+ source region 225 is isolated from the N+ Nwell contact region 227 by a trench isolation region 229s extending into the Nwell 223. The PFET 220 can further include, in and/or adjacent to the Pwell 222, a P+ drain region 224, wherein the P+ drain region 224 is laterally separated from a vertical junction between the deep Nwell 221 and the Pwell 222 by a trench isolation region 229d. The PFET 220 can further include a gate structure 226 on the top surface of the P-substrate 201 between the P+ source region 225 and the P+ drain region 224, but closer to the P+ source region 225. This gate structure 226 can, for example, extend laterally from above the Nwell 223, across the vertical junction between the Nwell 223 and the deep Nwell 221, across the vertical junction between the deep Nwell 221, and the Pwell 222 and onto the trench isolation region 229d. As mentioned above, LDMOS FETs, such as those described above and illustrated in FIG. 2 could be used for the transistors of the input buffer 100, as shown in the schematic diagram of FIG. 1. Such LDMOS FETs are advantageous because the extended drain region allows the drain-source voltage (VDS) to be increased. However, extending the drain region does not also result in a corresponding increase in the gate-source voltage (VGS). Thus, for example, the drain region of a 1.8V MOSFET can be extended to create an LDMOS FET with a VDS of 5.0V, but its VGS will still be limited to 1.8V (max=1.8+10%=1.98V). Similarly, the drain region of 2.5V or 3.3V MOSFET can be extended to create an LDMOSFET with a VDS of up to, for example, 5V, but its VGS will still be limited 2.5V+10% or 3.3V+10% respectively. Thus, adding such LDMOS FETs to an input buffer can be beneficial, but care still needs to be taken during circuit design to avoid any max VGS limits associated with those devices. As described in detail below, the input buffer 100 disclosed herein is specifically designed to avoid such max VGS violations (e.g., when using LDMOSFETs with a 5.0V VDS but only a 1.98V max VGS).

It should be understood that the RFLDMOS FETs described above and illustrated in FIG. 2, are not intended to be limiting. Alternatively, the transistors of the input buffer 100 could be differently configured RFLDMOS FETs. Alternatively, the transistors of the input buffer 100 could be some other type of FET or some other type of transistor (e.g., a bipolar junction transistor (BJT), heterojunction bipolar transistor (HBT), etc.). For purposes of illustration, the transistors of the input buffer 100 are described below as being FETs, such as RFLDMOS FETs.

Returning to FIG. 1, the input buffer 100 can further include a chain 110 of first transistors connected in series between a positive voltage rail 181 at VDD and a ground rail 185 at VSS. The chain 110 can include two first PFETs 101-102 and two first NFETs 111-112. The gates of the two first PFETs 101-102 and the two first NFETs 111-112 can be controlled either directly or indirectly by the D_INbuffer on the input node 191, as discussed in greater detail below. The chain 110 can further include two intermediate nodes 193 and 195 and an output node 196. The two intermediate nodes can include a first intermediate node 193 at a junction between the two first PFETs 101-102 and a second intermediate node 195 at a junction between the two first NFETs 111-112. The output node 196 can be at a junction between the two first PFETs 101-102 and the two first NFETs 111-112.

Optionally, the input buffer 100 can further include a footer device 120 connected between the chain 110 and, particularly, the source region of the first NFET 112 and the ground rail 185. The footer device 120 can, for example, be an additional NFET having a drain region connected to the source region of the first NFET 112, having a source region connected to the ground rail 185, and further having a gate connected to receive an enable signal (EN), as illustrated, that swings between 0.0V and VREFn. When EN is high and, particularly, at VREFn, the NFET is turned on to enable input buffer operation, whereas, when EN is low (e.g., 0.0V), the NFET is turned off to disable input buffer operation. Alternatively, the footer device 120 could be another other suitable type of footer device. For example, the footer device 120 could be a transmission gate with parallel-connected N-channel and P-channel FETs connected between the source region of the first NFET 112 and the ground rail 185 and having corresponding gates connected to receive EN and an inverted enable signal (ENb), respectively.

Additionally, or alternatively, the input buffer 100 can further include a pull-up device 130 connected between the positive voltage rail 181 (VDD) and the output node 196. The pull-up device can, for example, be a PFET having a source region connected to the positive voltage rail 181, a drain region connected to the output node 196, and a gate connected to receive an additional enable signal (ENp) that swings between VDD and VREFp. When ENp is at VREFp, input buffer operation is disabled. When ENp is at VDDo, input buffer operation is enabled. Alternatively, the pull-up device 130 could be another suitable type of pull-up device. For example, the pull-up device 130 could be a transmission gate with parallel-connected N-channel and P-channel FETs connected between the output node 196 and the positive voltage rail 181.

The input buffer 100 can further include a hysteresis feedback loop 150. The hysteresis feedback loop 150 can include two second transistors and, particularly, a second PFET 104 and a second NFET 114. The second PFET 104 can be connected between the first intermediate node 193 and the ground rail 185. Specifically, the second PFET 104 can have a source region connected to the first intermediate node 193 at the junction between the two first PFETs 101-102 in chain 110, a drain region connected to the ground rail 185, and a gate. The second NFET 114 can be connected between the second intermediate node 195 and the positive voltage rail 181. Specifically, the second NFET 114 can include a source region connected to the second intermediate node 195 at the junction between the two first NFETs 111-112 in chain 110, a drain region connected to the positive voltage rail 181, and a gate.

In a conventional hysteresis feedback loop, the gates of the second PFET 104 and the second NFET 114 would be directly connected to the output node 196.

In the hysteresis feedback loop 150 of the disclosed input buffer 100, voltage protection devices 105 and 115 are connected between the output node 196 and the gates of the second PFET 104 and the second NFET 114, respectively. These voltage protection devices 105 and 115 can specifically be configured to limit the gate voltages of the second PFET 104 and the second NFET 114 to further assist in the prevention of maximum gate-to-source voltage violations of the second PFET 104 and the second NFET 114. These voltage protection devices 105 and 115 can also specifically be configured to limit the source voltages of the second PFET 104 and the second NFET 114 and, thereby the voltages on the first intermediate node 193 and the second intermediate node 195, when necessary, to prevent maximum gate-to-source voltage violations in the chain 110, as discussed in greater detail below. In some embodiments, these voltage protection devices 105 and 115 can be third transistors and, particularly, a third PFET 105 and a third NFET 115. The third PFET 105 can have a source region connected to the gate of the second PFET 104, a drain region connected to the output node 196, and a gate connected to receive a first reference voltage (VREFp) (e.g., from a reference voltage generator). The third NFET 115 can have a source region connected to the gate of the second NFET 114, a drain region connected to the output node 196, and a gate connected to receive a second reference voltage (VREFn) (e.g., from a reference voltage generator). VREFp and VREFn can be used to control the voltages applied by the third PFET 105 and the third NFET 115 to the gates of the second PFET 104 and the second NFET 114, respectively, to control the source voltages of the second PFET 104 and the second NFET 114 and thereby to control the voltages on the first intermediate node 193 and the second intermediate node 195, when necessary, to prevent maximum gate-to-source voltage violations, as discussed in greater detail below. Reference voltage generators are well known in the art and, thus, are not shown and the details thereof are not described herein in order to allow the reader to focus on the salient aspects of the disclosed embodiments. Alternatively, the voltage protection devices can be any other voltage protection devices configured to limit the source voltages of the second PFET 104 and the second NFET 114 and, thereby the voltages on the first intermediate node 193 and the second intermediate node 195, when necessary, to prevent maximum gate-to-source voltage violations in the chain 110.

As mentioned above, the gates of the two first PFETs 101-102 and the two first NFETs 111-112 in the chain 110 can be controlled directly by the D_INbuffer on the input node 191. That is, the input node 191 can be electrically connected directly to the gates of the two first PFETs 101-102 and the two first NFETs 111-112.

Alternatively, the input buffer 100 can further include additional voltage protection devices 103 and 113. These additional voltage protection devices 103 and 113 can specifically be configured to limit the gate voltages of the first PFETs 101-102 and the first NFETs 111-112 to further assist in the prevention of maximum gate-to-source voltage violations in the chain 110.

In some embodiments, these voltage protection devices 103 and 113 can be fourth transistors and, particularly, a fourth PFET 103 and a fourth NFET 113. The fourth PFET 103 can have a source region connected to the input node 191, a drain region connected to a PFET gate node 192 (i.e., a common gate node of the first PFETs 101-102), and a gate connected to receive VREFp (i.e., the same first reference voltage received by the third PFET 105 in the hysteresis feedback loop 150). The fourth NFET 113 can have a drain region connected to the input node 191, a source region connected to an NFET gate node 194 (i.e., a common gate node of the first NFETs 111-112), and a gate connected to receive VREFn (i.e., the same second reference voltage received by the third NFET 115 in the hysteresis feedback loop 150). VREFp and VREFn can be used to control the voltages applied by the fourth PFET 103 and the fourth NFET 113 to the gates of the first PFETs 101-102 and the first NFETs 111-112, respectively, and thereby to assist in the prevention of maximum gate-to-source voltage violations. Alternatively, these additional voltage protection devices can be any other voltage protection devices configured to limit the gate voltages applied to the gates of the first transistors in chain 110.

Figure 3:
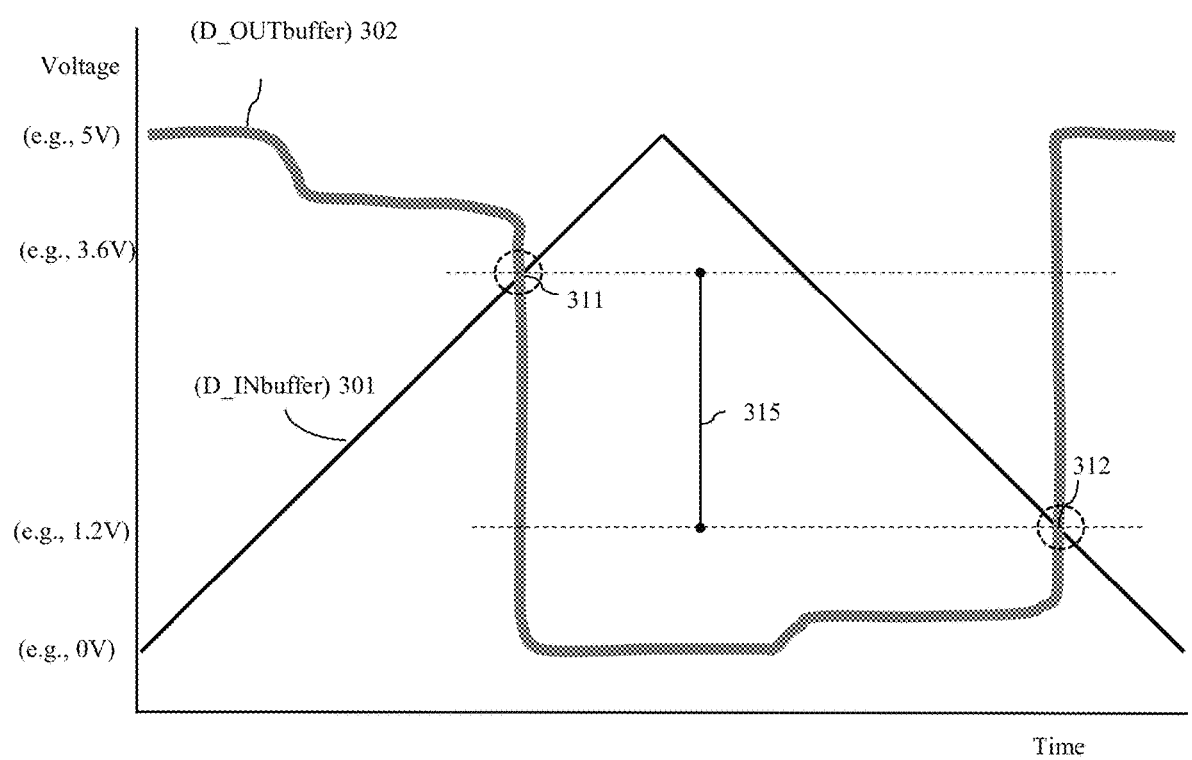
FIG. 3 is a timing diagram illustrative of data input and output signals during input buffer operation.

With reference to the timing diagram of FIG. 3, consider, for example, operation of an input buffer 100 as described above and illustrated in FIG. 1, where VDD is 5.0V and VSS is 0.0V such that the VDD to VSS swing is 5.0V and where the transistors have a VGSmax limitation of 1.98V. In the timing diagram of FIG. 3, the voltage level of D_INbuffer at the input node 191 over time is represented by the curve 301 and the corresponding voltage level of D_OUTbuffer at the output node 196 over time is represented by the curve 302.

When the footer device is in an ON state and the D_INbuffer (as indicated by the curve 301) at the input node 191 begins to transition from a logic 0 (e.g., at 0.0V) to a logic 1 (e.g., a 5.0V), hysteresis is created by the NFETs 114-115 in the hysteresis feedback loop 150 in combination with the NFETs 111-113. Additionally, the NFETs 113 and 115, in combination, prevent VGSmax violations in the NFETs 111-112 during the logic 0 to logic 1 transition at the input node 191. Specifically, the NFET 113 limits the voltage applied to the gate node 194 of the NFETs 111-112 to the second reference voltage (VREFn) minus the threshold voltage (VTn) of the NFETs (i.e., to VREFn-VTn). Additionally, the NFET 115 limits the voltage applied to the gate of the NFET 114 to VREFn-VTn to protect NFET 114, and, thus, the NFET 114 limits the voltage at the second intermediate node 195 (i.e., at the junction between the drain region of the NFET 112 and the source region of the NFET 111) to VREFn−2VTn. With the second intermediate node 195 at VREFn−2VTn and the gate node 194 for the NFETs 111-112 being at VREFn-VTn, the NFET 111 only sees a VGS that is essentially equal to VTn. Furthermore, with the second intermediate node 195 starting at a voltage of VREFn−2VTn instead of at 0.0V, the switch point of D_OUTbuffer at the output node 196 from a logic 1 to a logic 0 in response to switching of D_INbuffer at the input node 191 from a logic 0 to a logic 1 increases above a mid-voltage level (e.g., above 2.5V). For example, see the rising edge switch point 311 at approximately 3.6V where D_OUTbuffer 302 finally begins to fall as D_INbuffer 301 rises.

Subsequently, when the footer device is in an ON state and the D_INbuffer (as indicated by the curve 301) at the input node 191 begins to transition back to a logic 0 from a logic 1, hysteresis is created by the PFETs 104-105 in the hysteresis feedback loop 150 in combination with the PFETs 101-103. Additionally, the PFETs 103 and 105, in combination, prevent VGSmax violations in the PFETs 101-102 and PFET 104 during the logic 1 to logic 0 transition at the input node 191. Specifically, the PFET 103 limits the voltage applied at the gate node 192 of the PFETs 101-102 to the first reference voltage (VREFp) plus the threshold voltage (VTp) of the PFETs (i.e., to VREFp+VTp) instead of VSS. Additionally, the PFET 105 limits the voltage applied to the gate of the PFET 104 to VREFp+VTp to protect PFET 104, and, thus, the PFET 104 limits the voltage at the first intermediate node 193 (i.e., at the junction between the drain region of the PFET 101 and the source region of the PFET 102) to VREFp+2VTp. With the first intermediate node 193 at VREFp+2VTp and the gate node 192 for the PFETs 101-102 being at VREFp+VTp, the PFET 102 only sees a VGS that is essentially equal to VTp. Furthermore, with the first intermediate node 193 starting at a voltage of VREFpe+2VTp instead of at 0V, the switch point of D_OUTbuffer at the output node 196 from a logic 0 to a logic 1, in response to switching of D_INbuffer at the input node 191 from a logic 1 to a logic 0, decreases below the mid-voltage level. For example, see the falling edge switch point 312 at approximately 1.2 V where D_OUTbuffer 302 finally begins to rise as D_INbuffer 301 falls. The hysteresis level 315 is the difference between the voltage at rising edge switch point 311 and the voltage at the falling edge switch point 312 (e.g., 3.6V-1.2V equals a hysteresis level 315 of 2.4V).

Figure 4:
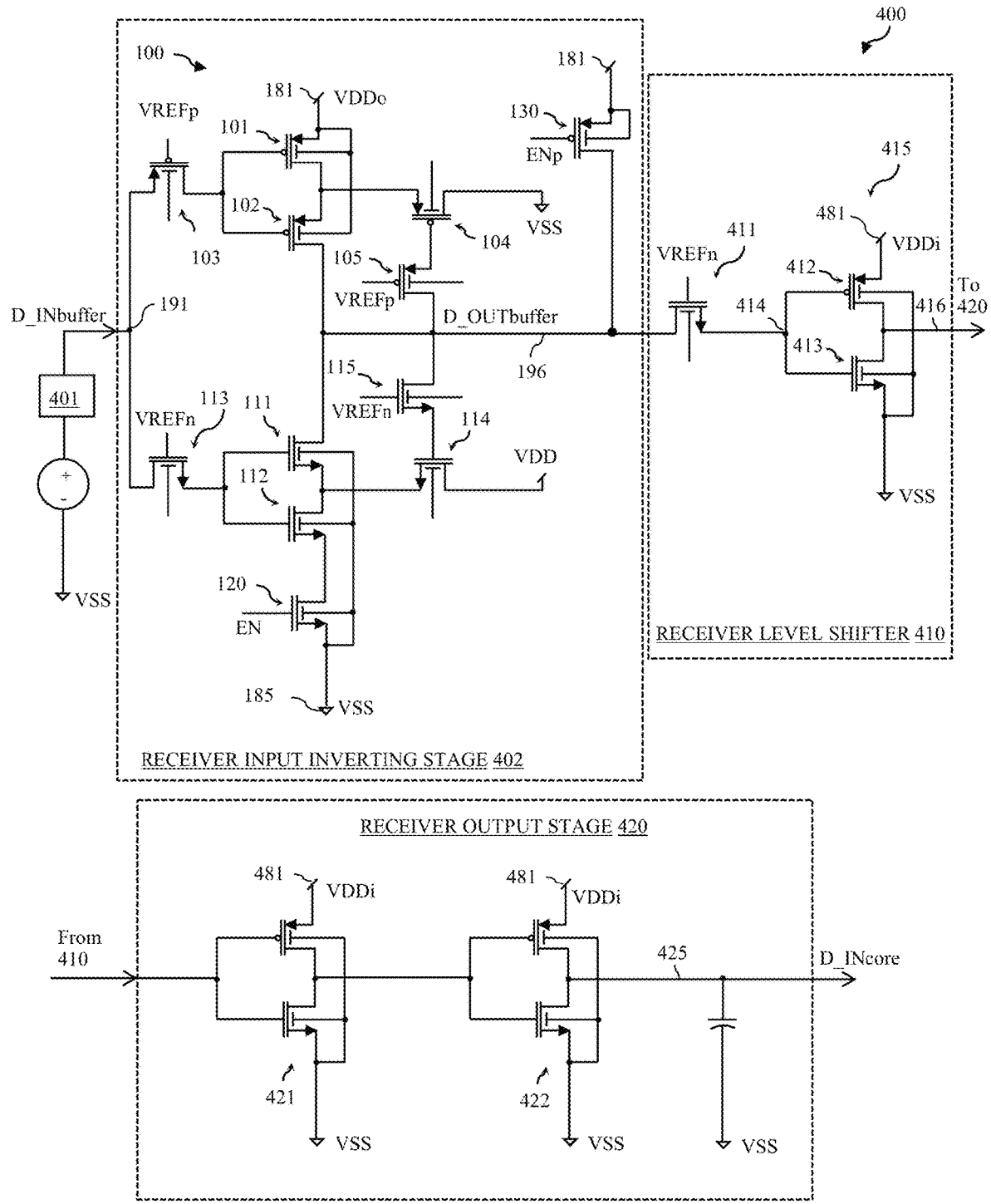
FIG. 4 is a schematic diagram illustrating disclosed embodiments of a receiver.

Also disclosed herein are embodiments of a receiver (e.g., an RF receiver) incorporating the disclosed input buffer as a receiver input stage. More particularly, FIG. 4 is a schematic diagram illustrating a receiver 400. The receiver 400 can include an input/output pad 401, a receiver input stage 402 (also referred to herein as a receiver input inverting stage), a receiver level shifter 410 (also referred to herein as a level shifter or voltage level shifter), and a receiver output stage 420.

The receiver input stage 402 can include an input buffer 100 (e.g., an RF input buffer) with voltage protection devices 105 and 115 (also referred to herein as hysteresis-integrated voltage protection devices), as described in detail above. The input node 191 of the input buffer 100 can be connected to receive D_INbuffer from the input/output pad 401. As mentioned above, the input buffer 100 can be connected to a positive voltage rail 181 at a positive supply voltage (VDD). In this description of the receiver 400, the positive supply voltage for the receiver input stage 402 is specifically a first positive supply voltage (VDDo) on a first positive voltage rail 181, which is relatively high (e.g., 3.0 volts (V) to 6.5V (e.g., 5V) or even higher).

The receiver level shifter 410 can include an inverter 415. The inverter 415 can include, for example, a PFET 412 and NFET 413 connected in series between a second positive voltage rail 481 at a second positive supply voltage level (VDDi). VDDi can be less than VDDo. For example, in some embodiments, VDDi can be relatively low (e.g., 0.5V-1.0V, such as 0.8V). The inverter 415 can include an inverter input node 414 connected to the gates of the PFET 412 and NFET 413 and an inverter output node 416 at the junction between the PFET 412 and the NFET 413. The receiver level shifter 410 can further include an additional NFET 411 having a drain region connected to receive D_OUTbuffer, a source region connected to the inverter input node 414, and a gate connected to receive VREFn. Thus, the NFET 411 limits the voltage applied to the inverter input node 414 and, thereby to the gates of the PFET 412 and NFET 413 to VREFn-VTn. Additionally, voltage swing at the inverter output node 416 will be between 0.0V and VDDi and, thus, level-shifted downward. When D_OUTbuffer is at a logic 0 (0.0V), PFET 412 will be ON, NFET 413 will be OFF and the inverter output node 416 will be pulled up to a logic 1 but only at VDDi.

Figure 5:
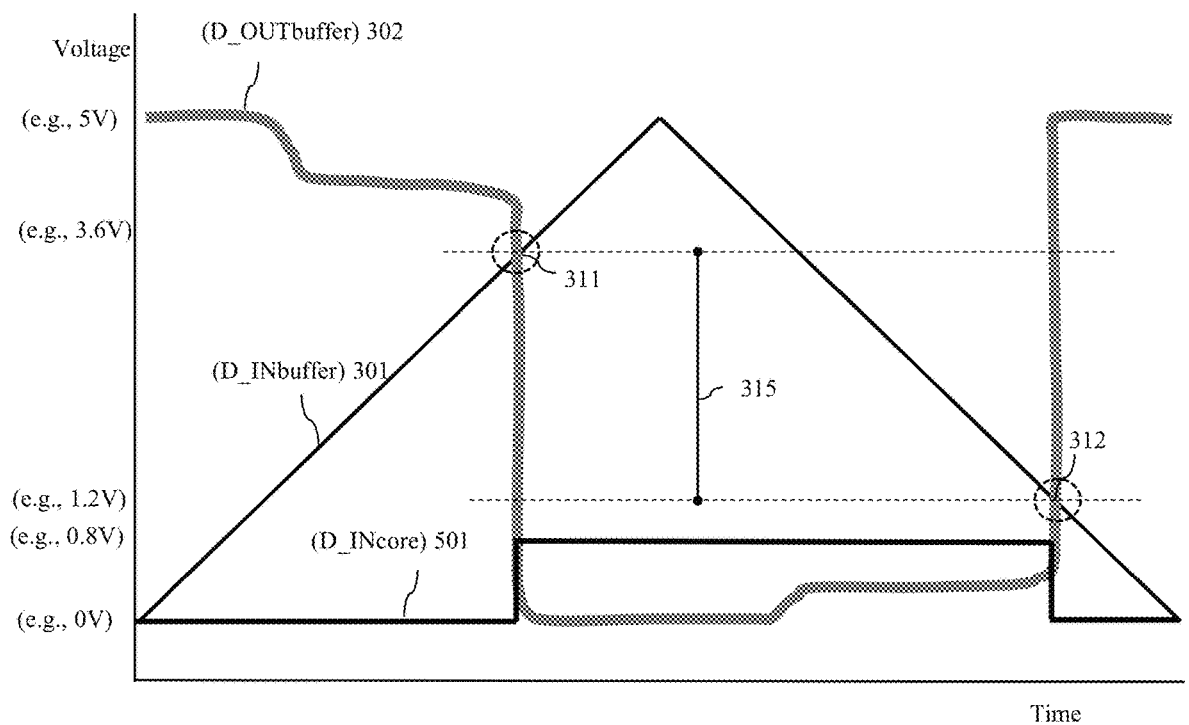
FIG. 5 is a timing diagram illustrative of data input and output signals during receiver operation.

Finally, the receiver output stage 420 can include a pair of series-connected inverters 421 and 422, each having a PFET and an NFET connected in series between the second positive voltage rail 481 and ground. The series-connected inverters 421-422 can have an input end connected to the inverter output node 416 of the receiver level shifter 410 and an output end 425, which supplies the data input (D_INcore) to other on-chip structures (e.g., the core). FIG. 5 is an additional timing diagram illustrating D_INcore at the output end 425 as indicated by curve 501. As illustrated, D_INcore at the output end 425 of the receiver output stage 420 is relatively stable with sharp transition between logic 0 (0.0V) and logic 1 (VDDi) and vice versa concurrent with the switching points 311 and 312, described above with regard to the timing diagram of FIG. 3.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a positive voltage rail at a positive supply voltage level;
a chain of first transistors connected in series between the positive voltage rail and ground and including: two intermediate nodes and an output node; and
a hysteresis feedback loop including:
two second transistors connected to the two intermediate nodes, respectively; and
two voltage protection devices connected to gates of the two second transistors, respectively, and to the output node,
wherein all transistors in the structure are laterally diffused metal oxide semiconductor field effect transistors with a maximum gate-to-source voltage limit that is less than the positive supply voltage level.

2. The structure of claim 1,
wherein the chain of the first transistors includes: two first P-channel transistors; a first intermediate node at a junction between the two first P-channel transistors; two first N-channel transistors; a second intermediate node at a junction between the two first N-channel transistors; and the output node at a junction between the two first P-channel transistors and the two first N-channel transistors, and
wherein the two second transistors of the hysteresis feedback loop include: a second P-channel transistor connected between the first intermediate node and ground and a second N-channel transistor connected between the second intermediate node and the positive voltage rail,
wherein the two voltage protection devices include: a third P-channel transistor; and a third N-channel transistor.

3. The structure of claim 2, further comprising:
an input node;
a fourth P-channel transistor connected between the input node and gates of the two first P-channel transistors; and
a fourth N-channel transistor connected between the input node and gates of the two first N-channel transistors.

4. The structure of claim 3,
wherein gates of the third P-channel transistor and the fourth P-channel transistor are connected to receive a first reference voltage, and
wherein gates of the third N-channel transistor and the fourth N-channel transistor are connected to receive a second reference voltage.

5. The structure of claim 3, wherein the input node is connected to receive an input signal that swings between logic 0 at 0.0 volts and logic 1 at approximately the positive supply voltage level.

6. The structure of claim 1,
wherein the two voltage protection devices have gates connected to receive different reference voltages to protect against violations of the maximum gate-to-source voltage limit in the first transistors.

7. The structure of claim 1,
wherein the maximum gate-to-source voltage limit is less than 2.0 volts, and
wherein the positive supply voltage level is at least 3.0 volts.

8. The structure of claim 1, further comprising a pull-up transistor having a drain region connected to the output node and a source region connected to the positive voltage rail.

9. A structure comprising:
a positive voltage rail at a positive supply voltage level;
a chain of first transistors connected in series and including: two first P-channel transistors; a first intermediate node at a junction between the two first P-channel transistors; two first N-channel transistors; a second intermediate node at a junction between the two first N-channel transistors; and an output node at a junction between the two first P-channel transistors and the two first N-channel transistors; and
a hysteresis feedback loop including:
two second transistors including: a second P-channel transistor connected between the first intermediate node and ground; and a second N-channel transistor connected between the second intermediate node and the positive voltage rail; and
two third transistors including: a third P-channel transistor connected between a gate of the second P-channel transistor and the output node; and a third N-channel transistor connected between a gate of the second N-channel transistor and the output node; and
a pull-up transistor connected in parallel with the two first P-channel transistors,
wherein the pull-up transistor has a drain region connected to the output node and a source region connected to the positive voltage rail, and
wherein all transistors in the structure are laterally diffused metal oxide semiconductor field effect transistors with a maximum gate-to-source voltage limit that is less than the positive supply voltage level.

10. The structure of claim 9, further comprising:
an input node;
a fourth P-channel transistor connected between the input node and gates of the two first P-channel transistors; and
a fourth N-channel transistor connected between the input node and gates of the two first N-channel transistors.

11. The structure of claim 10,
wherein gates of the third P-channel transistor and the fourth P-channel transistor are connected to receive a first reference voltage, and
wherein gates of the third N-channel transistor and the fourth N-channel transistor are connected to receive a second reference voltage.

12. The structure of claim 10, wherein the input node is connected to receive an input signal that swings between logic 0 at 0.0 volts and logic 1 at approximately the positive supply voltage level.

13. The structure of claim 9,
wherein all transistors in the structure are laterally diffused metal oxide semiconductor field effect transistors, and
wherein the two third transistors have gates connected to receive different reference voltages, respectively, to protect against violations of the maximum gate-to-source voltage limit in the first transistors.

14. The structure of claim 9,
wherein the maximum gate-to-source voltage limit is less than 2.0 volts, and
wherein the positive supply voltage level is at least 3.0 volts.

15. The structure of claim 9, further comprising a footer transistor connected in series between the chain and ground.

16. A structure comprising:
a receiver input stage connected to a first positive voltage rail at a first positive supply voltage level, wherein the receiver input stage includes a hysteresis input buffer and wherein the hysteresis input buffer includes:
a chain of first transistors connected in series between the first positive voltage rail and ground and including: two intermediate nodes and an output node; and
a hysteresis feedback loop including:
two second transistors connected to the two intermediate nodes, respectively; and
two voltage protection devices connected to gates of the two second transistors, respectively, and to the output node,
wherein all transistors in the structure are laterally diffused metal oxide semiconductor field effect transistors with a maximum gate-to-source voltage limit that is less than the first positive supply voltage level;
a receiver output stage; and
a receiver level shifter connected between the output node of the receiver input stage and the receiver output stage, wherein the receiver level shifter and the receiver output stage are connected to a second positive voltage rail at a second positive supply voltage level that is less than the maximum gate-to-source voltage limit.

17. The structure of claim 16,
wherein the chain of the first transistors includes: two first P-channel transistors; a first intermediate node at a junction between the two first P-channel transistors; two first N-channel transistors; a second intermediate node at a junction between the two first N-channel transistors; and the output node at a junction between the two first P-channel transistors and the two first N-channel transistors,
wherein the two second transistors of the hysteresis feedback loop include: a second P-channel transistor connected between the first intermediate node and ground and a second N-channel transistor connected between the second intermediate node and the first positive voltage rail, and
wherein the two voltage protection devices include: a third P-channel transistor; and a third N-channel transistor.

18. The structure of claim 17, wherein the hysteresis input buffer further includes:
an input node connected to an input/output pad to receive an input signal that swings between a logic 0 at 0.0 volts and a logic 1 at approximately the first positive supply voltage level;
a fourth P-channel transistor connected between the input node and gates of the two first P-channel transistors; and
a fourth N-channel transistor connected between the input node and gates of the two first N-channel transistors,
wherein gates of the third P-channel transistor and the fourth P-channel transistor are connected to receive a first reference voltage, and wherein gates of the third N-channel transistor and the fourth N-channel transistor are connected to receive a second reference voltage.

19. The structure of claim 16,
level, and
wherein the two voltage protection devices have gates connected to receive different reference voltages to protect against violations of the maximum gate-to-source voltage limit in the first transistors.

20. The structure of claim 19,
wherein the first positive supply voltage level is above 3.0 volts, wherein the second positive supply voltage level is between 0.5 volts and 1.0 volts, and wherein the maximum gate-to-source voltage limit is less than 2.0 volts.

* * * * *